(12) United States Patent
Takata et al.

(10) Patent No.: US 6,873,209 B2
(45) Date of Patent: Mar. 29, 2005

(54) INPUT BUFFER CIRCUIT HAVING FUNCTION OF CANCELING OFFSET VOLTAGE

(75) Inventors: Kengo Takata, Tokyo (JP); Tsutomu Yoshimura, Tokyo (JP); Harufusa Kondo, Tokyo (JP); Hironobu Ito, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 26 days.

(21) Appl. No.: 10/670,217

(22) Filed: Sep. 26, 2003

(65) Prior Publication Data

US 2004/0227572 A1 Nov. 18, 2004

(30) Foreign Application Priority Data

May 14, 2003 (JP) ........................................ 2003-135339

(51) Int. Cl.[7] ................................................ H03F 3/45
(52) U.S. Cl. ........................................ 330/253; 330/260
(58) Field of Search ................................ 330/253, 254, 330/258, 259, 260, 261, 277, 290, 296; 327/359

(56) References Cited

U.S. PATENT DOCUMENTS

| | | | | |
|---|---|---|---|---|
| 4,578,647 A | * | 3/1986 | Sasamura | .................. 330/253 |
| 4,841,254 A | * | 6/1989 | Bukowski et al. | .......... 330/253 |
| 5,130,666 A | * | 7/1992 | Nicollini | ...................... 330/253 |
| 5,187,448 A | * | 2/1993 | Brooks et al. | .............. 330/258 |
| 5,394,113 A | * | 2/1995 | Belcher | ....................... 330/260 |
| 6,362,687 B2 | * | 3/2002 | Cox | ............................ 330/253 |

FOREIGN PATENT DOCUMENTS

| | | |
|---|---|---|
| JP | 4-192703 | 7/1992 |
| JP | 2002-9561 | 1/2002 |
| JP | 2003-8407 | 1/2003 |

* cited by examiner

*Primary Examiner*—Henry Choe
(74) *Attorney, Agent, or Firm*—Oblon, Spivak, McClelland, Maier & Neustadt, P.C.

(57) ABSTRACT

An input buffer circuit without a drop of a capability of a circuit and a limitation of a connection type with a circuit of a former stage is obtained. The output signal (OUTB) is inputted to a first low pass filter circuit, and the first low pass filter circuit integrates the output signal (OUTB). A result of the integration is stored as a voltage value (V2$a$) in the capacitor (4$s$). In the same manner, an output signal (OUT) is inputted to a second low pass filter circuit, and the second low pass filter circuit integrates the output signal (OUT). A result of the integration is stored as a voltage value (V2$b$) in a capacitor (4$t$). A differential amplifier circuit (5) generates appropriate voltages (V3$a$ and V3$b$) according to a design specification of the transistors (1$x$ and 1$y$) by amplifying the voltage values (V2$a$ and V2$b$) and outputs them. The voltages (V3$a$ and V3$b$) are impressed on respective back gates of the transistors (1$x$ and 1$y$), respectively.

4 Claims, 3 Drawing Sheets

F I G. 5
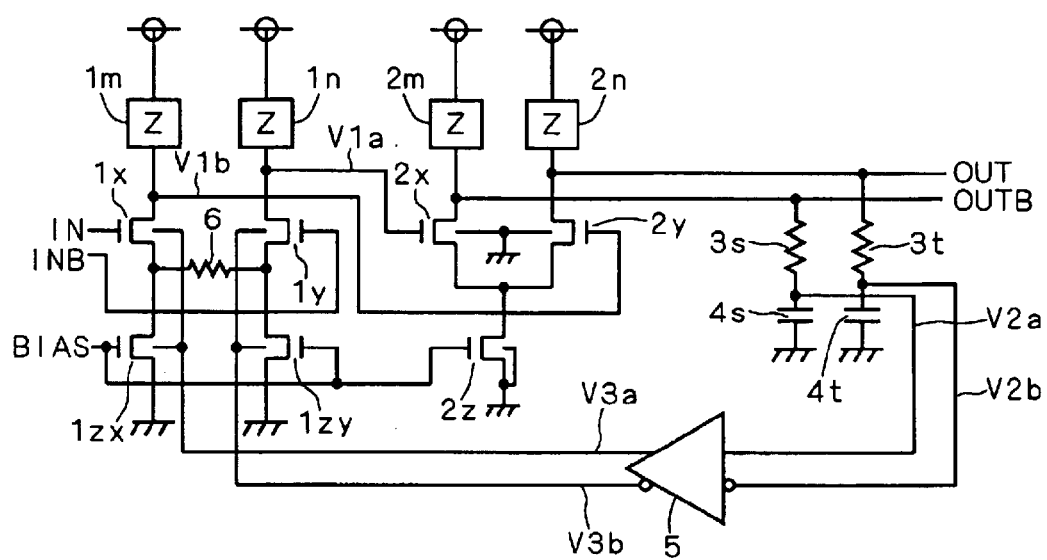

INPUT BUFFER CIRCUIT HAVING FUNCTION OF CANCELING OFFSET VOLTAGE

BACKGROUND OF THE INVENTION

1. Field of the Invention

The present invention relates to an input buffer circuit having a function of canceling an offset voltage.

2. Description of the Background Art

In a conventional input buffer circuit having a composition that plural differential amplifier circuits are in a cascade connection with each other, various circuit elements such as a resistance for a voltage division, a terminating resistance and so on are connected with a data path (or a signal path) to cancel an offset voltage.

Besides, a technique corresponding to a method of canceling the offset voltage is disclosed in Japanese Patent Application Laid-Open Nos. 2002-9561, 2003-8407 and H04-192703 (1992).

However, according to the conventional input buffer circuit, a problem arises that there is a case that a capability of the input buffer circuit drops that a noise increases, a bandwidth of the differential amplifier circuit becomes narrow and so on under the influence of the circuit elements described above which are connected with the data path.

Moreover, a case can arise that the offset voltage cannot be appropriately canceled under the influence of a DC component included in a signal outputted from a circuit of a former stage. Accordingly, a problem arises that a connection type with a circuit of a former stage is limited to a connection type through a capacitor (a capacity coupling type).

SUMMARY OF THE INVENTION

It is an object of the present invention to obtain an input buffer circuit without a drop of a capability of a circuit and a limitation of a connection type with a circuit of a former stage.

The present invention is intended for an input buffer circuit to/from which first and second input signals are inputted and first and second output signals are outputted. According to the present invention, the input buffer circuit includes a first differential amplifier circuit, a first integration circuit, a second integration circuit and a first voltage converting circuit. The first output signal is inputted to the first integration circuit. The second output signal is inputted to the second integration circuit. The first voltage converting circuit converts voltage values outputted from the first and the second integration circuits, respectively. The first differential amplifier circuit has a first transistor having a gate to which the first input signal is inputted and a second transistor having a gate to which the second input signal is inputted. An output of the first voltage converting circuit is connected with respective back gates of the first and the second transistors.

The first voltage converting circuit outputs an integration result by the first integration circuit corresponding to the first output signal with converting into an appropriate voltage according to a design specification of the first transistor. Moreover, the first voltage converting circuit outputs an integration result by the second integration circuit corresponding to the second output signal with converting into an appropriate voltage according to a design specification of the second transistor. An offset voltage is cancelled by impressing each voltage outputted from the first voltage converting circuit on the respective back gates of the first and the second transistors.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a circuit diagram illustrating a composition of an input buffer circuit according to a preferred embodiment 4 of the present invention.

DESCRIPTION OF THE PREFERRED EMBODIMENTS

Preferred Embodiment 1.

Figure 1:
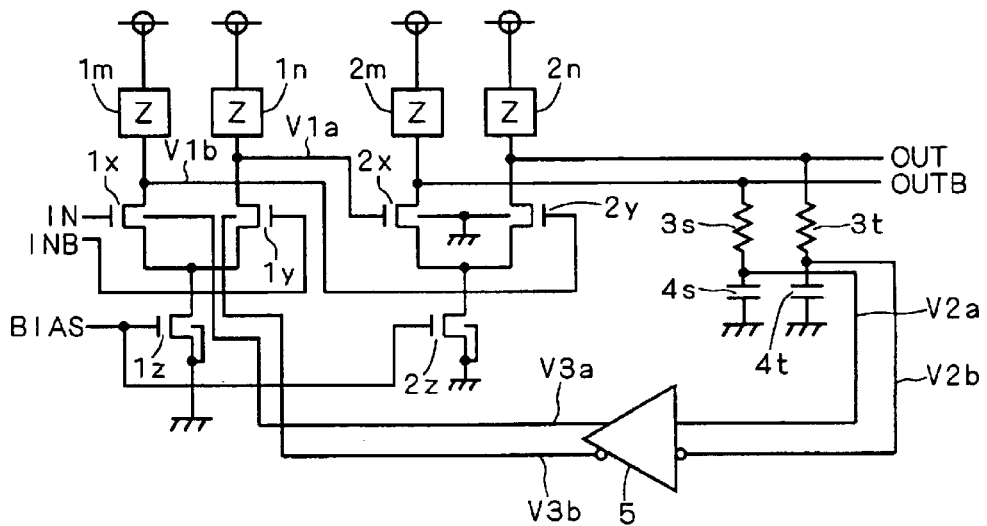
FIG. 1 is a circuit diagram illustrating a composition of an input buffer circuit according to a preferred embodiment 1 of the present invention.

FIG. 1 is a circuit diagram illustrating a composition of an input buffer circuit according to the preferred embodiment 1 of the present invention. The input buffer circuit having a composition that two differential amplifier circuits are in a cascade connection with each other is illustrated in FIG. 1. However, the number of the differential amplifier circuit is not limited to two, but the input buffer circuit only has to include one or more differential amplifier circuits.

The input buffer circuit includes a differential amplifier circuit of a first stage, a differential amplifier circuit of a second stage, a first and a second low pass filter circuits functioning as an integration circuit and a differential amplifier circuit 5 functioning as a voltage converting circuit. In this regard, a level shifter circuit can be placed in exchange for the differential amplifier circuit 5.

The differential amplifier circuit of the first stage has loads 1m and 1n and n channel MOLESTS (simply described as "transistor" hereinafter) 1x, 1y and 1z. A drain of the transistor 1x is connected with a source potential through the load 1m. A source of the transistor 1x is connected with a drain of the transistor 1z. An input signal IN is inputted to a gate of the transistor 1x from a circuit of the former stage which not shown in FIG. 1 (for example, a transimpedance amp sealed off in the same case as a photodiode). A drain of the transistor 1y is connected with a source potential through the load 1n. A source of the transistor 1y is connected with the drain of the transistor 1z. An input signal INB is inputted to a gate of the transistor 1y from the circuit of the former stage described above. The transistor 1z functions as a constant current source of the differential amplifier circuit of the first stage. A source and a back gate of the transistor 1z are connected with a ground potential. A determined bias voltage BIAS is inputted to a gate of the transistor 1z.

The differential amplifier circuit of the second stage has loads 2m and 2n and transistors 2x, 2y and 2z. A drain of the transistor 2x is connected with a source potential through the load 2m. A source of the transistor 2x is connected with a drain of the transistor 2z. An output signal V1a outputted from the differential amplifier circuit of the first stage is inputted to a gate of the transistor 2x. A drain of the transistor 2y is connected with a source potential through the load 2n. A source of the transistor 2y is connected with the drain of the transistor 2z. An output signal V1b outputted from the differential amplifier circuit of the first stage is inputted to a gate of the transistor 2y. Respective back gates of the transistor 2x and 2y are connected with a ground potential. The transistor 2z functions as a constant current source of the differential amplifier circuit of the second stage. A source and a back gate of the transistor 2z are connected with a ground potential. The bias voltage BIAS is inputted to a gate of the transistor 2z. Output signals OUT, OUTB which are output signals of the input buffer circuits are outputted from the differential amplifier circuit of the second stage.

As opposed to the example illustrated in FIG. 1, in case that the transistors 1z, 2x, 2y and 2z are p channel MOLESTS, respectively, the respective back gates of these transistors are connected with a source potential.

The output signal OUTB is inputted to the first low pass filter circuit. The first low pass filter circuit has a composition that a resistance 3s and a capacitor 4s are serially connected with each other between the output signal OUTB and the ground potential.

The output signal OUT is inputted to the second low pass filter circuit. The second low pass filter circuit has a composition that a resistance 3t and a capacitor 4t are serially connected with each other between the output signal OUT and the ground potential.

A first input terminal of the differential amplifier circuit 5 is connected with a serial connection point between the resistance 3s and the capacitor 4s. According to this, a voltage value V2a outputted from the first low pass filter circuit (that is to say, a potential of the capacitor 4s) is inputted to the first input terminal of the differential amplifier circuit 5. Moreover, a second input terminal of the differential amplifier circuit 5 is connected with a serial connection point between the resistance 3t and the capacitor 4t. According to this, a voltage value V2b outputted from the second low pass filter circuit (that is to say, a potential of the capacitor 4t) is inputted to the second input terminal of the differential amplifier circuit 5. The differential amplifier circuit 5 outputs a voltage V3a with converting the voltage value V2a, and outputs a voltage V3b with converting the voltage value V2b. A first output terminal of the differential amplifier circuit 5 is connected with the back gate of the transistor 1x. According to this, the voltage V3a is impressed on the back gate of the transistor 1x by the differential amplifier circuit 5. Moreover, a second output terminal of the differential amplifier circuit 5 is connected with the back gate of the transistor 1y. According to this, the voltage V3b is impressed on the back gate of the transistor 1y by the differential amplifier circuit 5.

In case of amplifying a low amplitude and a high frequency signal (for example, an output signal of the photodiode) by the input buffer circuit, the input signals IN and INB swing in a minute amplitude of the same degree in both a plus direction and a minus direction with a central focus on a direct-current voltage value called a common mode voltage without swinging fully to the source potential and the ground potential. Ideally, it is desirable that a common mode voltage corresponding to the output signal V1a is equal to a common mode voltage corresponding to the output signal V1b each other. However, a characteristic of the transistor 1x and a characteristic of the transistor 1y are different with each other due to the variation in manu-facture and so on, thus a potential difference (offset voltage) occurs between the common mode voltage corresponding to the output signal V1a and the common mode voltage corresponding to the output signal V1b.

A method of canceling the offset voltage in the input buffer circuit illustrated in FIG. 1 is described hereinafter. The output signal OUTB is inputted to the first low pass filter circuit, and the first low pass filter circuit integrates the output signal OUTB. A result of the integration is stored as the voltage value V2a in the capacitor 4s. In the same manner, the output signal OUT is inputted to the second low pass filter circuit, and the second low pass filter circuit integrates the output signal OUT. A result of the integration is stored as the voltage value V2b in the capacitor 4t. The offset voltage is reflected in a difference between the voltage value V2a and the voltage value V2b.

The differential amplifier circuit 5 generates appropriate voltages V3a and V3b according to the design specification of the differential amplifier circuit of the first stage, especially, a design specification of the transistors 1x and 1y by converting the voltage values V2a and V2b and outputs them. The voltages V3a and V3b are impressed on the respective back gates of the transistors 1x and 1y, respectively, and according to this, threshold voltages of the respective transistors 1x and 1y change, respectively. The offset voltage is cancelled when the respective threshold voltages of the transistors 1x and 1y change.

For example, it is assumed that the common mode voltage corresponding to the output signal V1a is higher than the common mode voltage corresponding to the output signal V1b. In this case, the common mode voltage corresponding to the output signal OUT becomes higher than the common mode voltage corresponding to the output signal OUTB. Accordingly, the voltage value V2b becomes higher than the voltage value V2a, and the voltage V3b becomes higher than the voltage V3a. The higher a voltage impressed on the back gate (body bias voltage) is, the larger a drain current of the transistor is, thus a voltage drop by the load in becomes larger than a voltage drop by the load 1m. As a result, the common mode voltage corresponding to the output signal V1a drops, and the common mode voltage corresponding to the output signal V1b rises. In this manner, the offset voltage is canceled.

Figure 2:
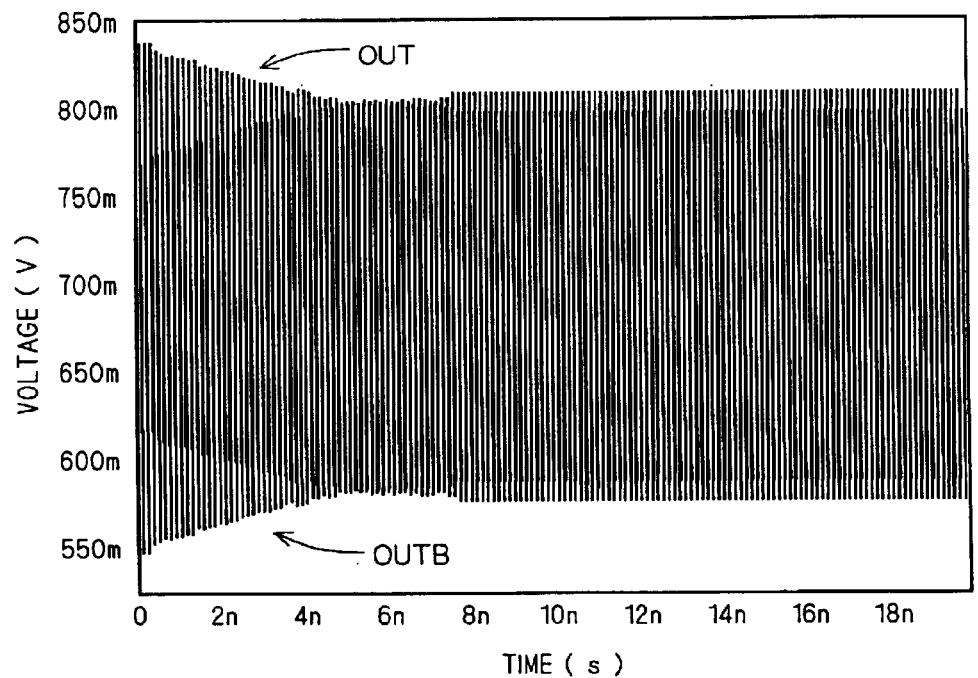
FIG. 2 is a graph showing an aspect that an offset voltage is cancelled.

FIG. 2 is graph showing an aspect that the offset voltage is canceled. In a primary state, the common mode, voltage corresponding to the output signal OUT is higher than the common mode voltage corresponding to the output signal OUTB, and the offset voltage occurs between them. However, it is noticed that the offset voltage is gradually canceled and after passing about 6 ns, the respective common mode voltages corresponding to the output signals OUT and OUTB become nearly equal.

In this manner, according to the input buffer circuit according to the present preferred embodiment 1, the offset voltage is canceled by impressing the voltages V3a and V3b on the respective back gates of the transistors 1x and 1y, respectively. Accordingly, it is not necessary to connect circuit elements such as a resistance for a voltage division, a terminating resistance and so on with a data path, thus a drop of a capability of the input buffer circuit under the influence of these circuit elements can be prevented. Moreover, a connection type with a circuit of a former stage is not limited to a capacity coupling type.

Moreover, for example, the input signals IN and INB are high frequencies of approximately 10 GHz, and in contrast, a response of control of the threshold voltage employing the back gate is approximately 1 GHz, lower than the high frequencies of the input signals IN and INB. However, according to the input buffer circuit according to the present preferred embodiment 1, values of the voltages V3$a$ and V3$b$ are determined with employing the respective integration results of the first and second low pass filter circuits, thus the voltages V3$a$ and V3$b$ impressed on the respective back gates of the transistors 1$x$ and 1$y$ do not transit at a high speed as compared with the input signals IN and INB. As a result, the offset voltage can appropriately be canceled.

Preferred Embodiment 2.

Figure 3:
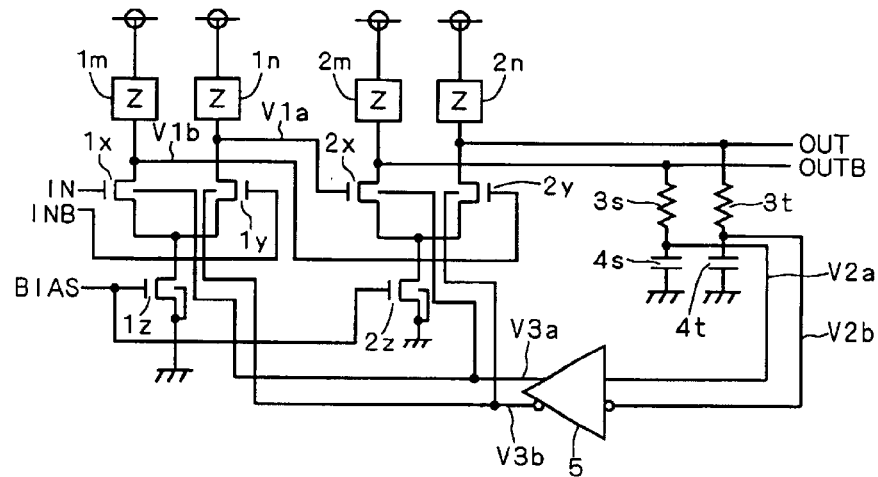
FIG. 3 is a circuit diagram illustrating a composition of an input buffer circuit according to a preferred embodiment 2 of the present invention.

FIG. 3 is a circuit diagram illustrating a composition of an input buffer circuit according to the preferred embodiment 2 of the present invention. The first output terminal of the differential amplifier circuit 5 is connected with the respective back gates of the transistors 1$x$ and 2$x$, respectively. According to this, the voltage V3$a$ is impressed on the respective back gates of the transistors 1$x$ and 2$x$ by the differential amplifier circuit 5, respectively. Moreover, the second output terminal of the differential amplifier circuit 5 is connected with the respective back gates of the transistors 1$y$ and 2$y$. According to this, the voltage V3$b$ is impressed on the respective back gates of the transistors 1$y$ and 2$y$ by the differential amplifier circuit 5, respectively. Other composition of the input buffer circuit according to the present preferred embodiment 2 is similar to the composition of the input buffer circuit according to the preferred embodiment 1 described above as shown in FIG. 1.

Besides, the input buffer circuit having a composition that two differential amplifier circuits are in a cascade connection with each other and the voltages V3$a$ and V3$b$ are impressed on the respective back gates of the transistors 1$x$ and 2$x$ and the transistors 1$y$ and 2$y$ is illustrated in FIG. 3. However, the number of the differential amplifier circuit is not limited to two, but two or more differential amplifier circuits only have to be in the cascade connection and the voltages V3$a$ and V3$b$ only have to be impressed on those two or more differential amplifier circuits.

In this manner, according to the input buffer circuit according to the present preferred embodiment 2, not only the offset voltage caused by the difference between the characteristic of the transistor 1$x$ and the characteristic of the transistor 1$y$ but also the offset voltage caused by a difference between a characteristic of the transistor 2$x$ and a characteristic of the transistor 2$y$ can be canceled.

Preferred Embodiment 3.

Figure 4:
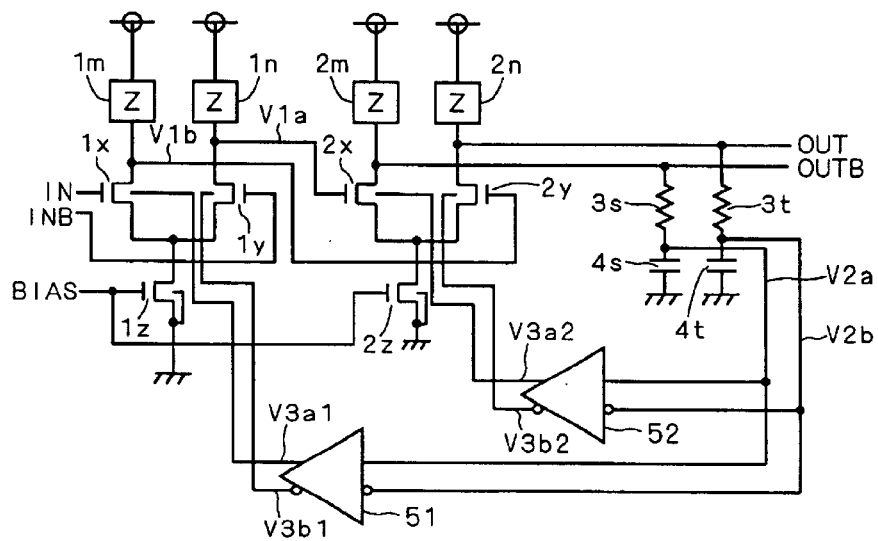
FIG. 4 is a circuit diagram illustrating a composition of an input buffer circuit according to a preferred embodiment 3 of the present invention.

FIG. 4 is a circuit diagram illustrating a composition of an input buffer circuit according to the preferred embodiment 3 of the present invention. A first input terminal of the differential amplifier circuit 51 (also called "voltage converting circuit" in the present preferred embodiment 3) is connected with a serial connection point between the resistance 3$s$ and the capacitor 4$s$. According to this, a voltage value V2$a$ outputted from the first low pass filter circuit is inputted to the first input terminal of the differential amplifier circuit 51. Moreover, a second input terminal of the differential amplifier circuit 51 is connected with a serial connection point between the resistance 3$t$ and the capacitor 4$t$. According to this, a voltage value V2$b$ outputted from the second low pass filter circuit is inputted to the second input terminal of the differential amplifier circuit 51.

The differential amplifier circuit 51 outputs a voltage V3$a$1 with converting the voltage value V2$a$, and outputs a voltage V3$b$1 with converting the voltage value V2$b$. The differential amplifier circuit 51 generates appropriate voltages V3$a$1 and V3$b$1 according to the design specification of the differential amplifier circuit of the first stage, especially, a design specification of the transistors 1$x$ and 1$y$ by converting the voltage values V2$a$ and V2$b$ and outputs them. A first output terminal of the differential amplifier circuit 51 is connected with the back gate of the transistor 1$x$. According to this, the voltage V3$a$1 is impressed on the back gate of the transistor 1$x$ by the differential amplifier circuit 51. Moreover, a second output terminal of the differential amplifier circuit 51 is connected with the back gate of the transistor 1$y$. According to this, the voltage V3$b$1 is impressed on the back gate of the transistor 1$y$ by the differential amplifier circuit 51.

A first input terminal of the differential amplifier circuit 52 (also called "voltage converting circuit" in the present preferred embodiment 3) is connected with a serial connection point between the resistance 3$s$ and the capacitor 4$s$. According to this, a voltage value V2$a$ outputted from the first low pass filter circuit is inputted to the first input terminal of the differential amplifier circuit 52. Moreover, a second input terminal of the differential amplifier circuit 52 is connected with a serial connection point between the resistance 3$t$ and the capacitor 4$t$. According to this, a voltage value V2$b$ outputted from the second low pass filter circuit is inputted to the second input terminal of the differential amplifier circuit 52.

The differential amplifier circuit 52 outputs a voltage V3$a$2 with converting the voltage value V2$a$, and outputs a voltage V3$b$2 with converting the voltage value V2$b$. The differential amplifier circuit 52 generates appropriate voltages V3$a$2 and V3$b$2 according to the design specification of the differential amplifier circuit of the second stage, especially, a design specification of the transistors 2$x$ and 2$y$ by converting the voltage values V2$a$ and V2$b$ and outputs them. A first output terminal of the differential amplifier circuit 52 is connected with the back gate of the transistor 2$x$. According to this, the voltage V3$a$2 is impressed on the back gate of the transistor 2$x$ by the differential amplifier circuit 52. Moreover, a second output terminal of the differential amplifier circuit 52 is connected with the back gate of the transistor 2$y$. According to this, the voltage V3$b$2 is impressed on the back gate of the transistor 2$y$ by the differential amplifier circuit 52. Other composition of the input buffer circuit according to the present preferred embodiment 3 is similar to the composition of the input buffer circuit according to the preferred embodiment 1 described above as shown in FIG. 1.

Besides, the input buffer circuit having a composition that two differential amplifier circuits are in a cascade connection with each other, two voltage converting circuits 51 and 52 are placed and the voltages V3$a$1, V3$b$1, V3$a$2 and V3$b$2 are impressed on the respective back gates of the transistors 1$x$, 1$y$, 2$x$ and 2$y$, respectively is illustrated in FIG. 4. However, the number of the differential amplifier circuit and the voltage converting circuit are not limited to two, respectively, but two or more differential amplifier circuits only have to be in the cascade connection, the voltages V3$a$1 and V3$b$1 only have to be impressed on those one or more differential amplifier circuits and the voltages V3$a$2 and V3$b$2 only have to be impressed on the other one or more differential amplifier circuits. Moreover, in case that three of more differential amplifier circuits are in the cascade connection, the voltage converting circuits of the same number as the differential amplifier circuits can also be placed, or, it is also applicable to place the voltage converting circuits of less number than the differential amplifier circuits, branching an output of one voltage converting circuit and inputting them to two or more differential amplifier circuits, in the same manner as the preferred embodiment 2 described above.

In this manner, according to the input buffer circuit according to the present preferred embodiment 3, not only the offset voltage caused by the difference between the characteristic of the transistor 1x and the characteristic of the transistor 1y but also the offset voltage caused by a difference between a characteristic of the transistor 2x and a characteristic of the transistor 2y can be canceled.

Furthermore, the differential amplifier circuit 51 corresponding to the differential amplifier circuit of the first stage and the differential amplifier circuit 52 corresponding to the differential amplifier circuit of the second stage are placed separately. Therefore, even in case that the characteristics of the transistors 1x and 1y and the characteristics of the transistors 2x and 2y are different with each other, the appropriate voltages V3a1, V3b1, V3a2 and V3b2 can be generated separately corresponding to the respective characteristics. As a result, the offset voltage corresponding to the differential amplifier circuit of the first stage and the offset voltage corresponding to the differential amplifier circuit of the second stage can be canceled more appropriately as compared with the input buffer circuit according to the preferred embodiment 2 described above.

Preferred Embodiment 4.

FIG. 5 is a circuit diagram illustrating an input buffer circuit according to the preferred embodiment 4 of the present invention. Transistors 1zx and 1zy are placed in exchange for the transistor 1z shown in FIG. 1. The transistors 1zx and 1zy function as a constant current source of the differential amplifier circuit of the first stage. Respective drains of the transistors 1x and 1y are connected with each other through a resistance 6.

A drain of the transistor 1zx is connected with the source of the transistor 1x. A source of the transistor 1zx is connected with the ground potential. The bias voltage BIAS is inputted to a gate of the transistor 1zx. The first output terminal of the differential amplifier circuit 5 is connected with respective back gates of the transistors 1x and 1zx. According to this, the voltage V3a is impressed to the respective back gates of the transistors 1x and 1zx by the differential amplifier circuit 5.

A drain of the transistor 1zy is connected with the source of the transistor 1y. A source of the transistor 1zy is connected with the ground potential. The bias voltage BIAS is inputted to a gate of the transistor 1zy. The second output terminal of the differential amplifier circuit 5 is connected with respective back gates of the transistors 1y and 1zy. According to this, the voltage V3b is impressed on the respective back gates of the transistors 1y and 1zy by the differential amplifier circuit 5.

Other composition of the input buffer circuit according to the present preferred embodiment 4 is similar to the composition of the input buffer circuit according to the preferred embodiment 1 described above as shown in FIG. 1. In FIG. 5, an example to apply an invention according to the present preferred embodiment 4 on a basis of the input buffer circuit according to the preferred embodiment 1 described above is illustrated, however, the invention according to the present preferred embodiment 4 is also applicable to the input buffer circuit according to the preferred embodiments 2 and 3 described above. For example, not only the transistor 1z of the differential amplifier circuit of the first stage but also the transistor 2z of the differential amplifier circuit of the second stage can be divided into two transistors 2zx and 2zy (not shown). Moreover, it is also applicable to branch the output of the differential amplifier circuit 5, input the voltage V3a to the transistors 2x and 2zx and input the voltage V3b to the transistors 2y and 2zy in the same manner as the preferred embodiment 2 described above. Or, it is also applicable to place the plural differential amplifier circuits 51 and 52, input the voltage V3a1 to the transistors 1x and 1zx from the differential amplifier circuit 51, input the voltage V3b1 to the transistors 1y and 1zy from the differential amplifier circuit 51, input the voltage V3a2 to the transistors 2x and 2zx from the differential amplifier circuit 52 and input the voltage V3b2 to the transistors 2y and 2zy from the differential amplifier circuit 52, respectively, in the same manner as the preferred embodiment 3 described above.

In this manner, according to the input buffer circuit according to the present preferred embodiment 4, the differential amplifier circuit 5 controls not only the respective body bias voltages of the transistors 1x and 1y but also the respective body bias voltages of the transistors 1zx and 1zy. According to this, the offset voltage can be canceled more effectively as compared with the input buffer circuit according to the preferred embodiment 1 described above.

While the invention has been shown and described in detail, the foregoing description is in all aspects illustrative and not restrictive. It is therefore understood that numerous modifications and variations can be devised without departing from the scope of the invention.

What is claimed is:

1. An input buffer circuit to/from which first and second input signals are inputted and first and second output signals are outputted, wherein said input buffer circuit comprises:

a first differential amplifier circuit;

a first integration circuit to which said first output signal is inputted;

a second integration circuit to which said second output signal is inputted; and a first voltage converting circuit converting a voltage value outputted from said first and second integration circuits, respectively, and said first differential amplifier circuit includes:

a first transistor including a gate to which said first input signal is inputted; and a second transistor including a gate to which said second input signal is inputted, and an output of said first voltage converting circuit is connected with respective back gates of said first and second transistors.

2. The input buffer circuit according to claim 1, wherein said input buffer circuit further comprises a second differential amplifier circuit which is in a cascade connection with said first differential amplifier circuit, and said second differential amplifier circuit includes:

a third transistor including a gate to which a third output signal outputted from said first differential amplifier circuit is inputted; and a fourth transistor including a gate to which a fourth output signal outputted from said first differential amplifier circuit is inputted, and said output of said first voltage converting circuit is further connected with respective back gates of said third and fourth transistors.

3. The input buffer circuit according to claim 1, wherein said input buffer circuit further comprises:

a second differential amplifier circuit which is in a cascade connection with said first differential amplifier circuit; and a second voltage converting circuit converting said voltage value outputted from said first and second integration circuits, respectively, and said second differential amplifier circuit includes:

a third transistor including a gate to which a third output signal outputted from said first differential amplifier circuit is inputted; and a fourth transistor including a gate to which a fourth output signal outputted from said first differential amplifier circuit is inputted, and an output of said second voltage converting circuit is connected with respective back gates of said third and fourth transistors.

4. The input buffer circuit according to claim 1, wherein said first differential amplifier circuit further comprises a constant current source including a fifth transistor connected with said first transistor and a sixth transistor connected with said second transistor, and said output of said first voltage converting circuit is further connected with respective back gates of said fifth and sixth transistors.

* * * * *